(12) United States Patent
Funabashi et al.

(10) Patent No.: US 6,493,369 B2
(45) Date of Patent: Dec. 10, 2002

(54) GAIN-COUPLING DISTRIBUTED FEEDBACK TYPE SEMICONDUCTOR LASER DEVICE

(75) Inventors: Masaki Funabashi, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/865,444

(22) Filed: May 29, 2001

(65) Prior Publication Data

US 2001/0046245 A1 Nov. 29, 2001

Related U.S. Application Data

(63) Continuation of application No. PCT/JP00/06705, filed on Sep. 28, 2000.

(30) Foreign Application Priority Data

Sep. 29, 1999 (JP) .......................................... 11-276981

(51) Int. Cl.[7] .............................. H01S 5/00; H01S 3/08
(52) U.S. Cl. .......................................... 372/49; 372/96
(58) Field of Search .............................. 372/46, 45, 49, 372/96

(56) References Cited

U.S. PATENT DOCUMENTS

| | | | | |
|---|---|---|---|---|
| 4,901,328 A | * | 2/1990 | Matsui et al. | 372/46 |
| 5,012,484 A | | 4/1991 | Flynn et al. | 372/96 |
| 5,015,964 A | * | 5/1991 | O'Mahony | 372/49 |
| 5,936,994 A | * | 8/1999 | Hong et al. | 372/96 |

FOREIGN PATENT DOCUMENTS

| | | |
|---|---|---|
| JP | 62-112391 | 5/1987 |
| JP | 62-159490 | 7/1987 |
| JP | 62-217689 | 9/1987 |
| JP | 63-17588 | 1/1988 |
| JP | 2-172289 | 7/1990 |
| JP | 2-246184 | 10/1990 |
| JP | 5-235465 | 9/1993 |
| JP | 6-152053 | 5/1994 |
| JP | 8-37342 | 2/1996 |
| JP | 11-87838 | 3/1999 |

OTHER PUBLICATIONS

1997 IEEE 9th International Conference on Indium Phosphide & Related Materials, M. Funabashi et al., "Comparison of InGaAs Absorptive Granting Structures in 1.55 μm InGaAsP/InP Strained MQW Gain–Coupled DFB Lasers", pp. 292–295. (No month available).

Hong et al, "Impact of Random Facet Phases on Modal Properties of Partly Gain–Coupled Distributed Feedback Lasers", IEEE J. Selected Topis in Quantum Electronics, vol. 3, No. 2, Apr. 1997, pp. 555–568.*

(List continued on next page.)

Primary Examiner—Quyen Leung
(74) Attorney, Agent, or Firm—Oblon, Spivak, McClelland, Maier & Neustadt, P.C.

(57) ABSTRACT

A gain-coupling distributed feedback type semiconductor laser device realizing a high light output power without causing an increase in the threshold current or a reduction in the emission efficiency, specifically a gain-coupling distributed feedback type semiconductor laser device comprised of a diffraction grating at least at part of the inside of a cavity and having a gain or loss periodically changing, a reflectance of one end surface (front facet) of the cavity being not more than 3% and the reflectance of the other end surface (rear facet) being larger than the reflectance of that one end surface and not more than 60%, such a gain-coupling distributed feedback type semiconductor laser device wherein the length of said cavity is at least 400 μm, and in particular such a gain-coupling distributed feedback type semiconductor laser device of an absorbing diffraction grating type.

16 Claims, 1 Drawing Sheet

OTHER PUBLICATIONS

Y. Nakano, et al., IEEE Photonics Technology Letters, vol. 4, No. 4, XP-000272600, pp. 308–311, "Highly Efficient Single Longitudinal–Mode Oscillation Capability of Gain–Coupled Distributed Feedback Semiconductor Lasers–Advantage of Asymmetric Facet Coating", Apr. 1, 1992.*

B. Chen, et al., Japanese Journal of Applied Physics, vol. 38, No. 9A, Part 1, XP-000947524, pp. 5096–5100, "A Novel 1.3-$\mu$m High $T_0$ AlGanAs/InP Strained–Compensated Multi-Quantum Well Complex–Coupled Distributed Feedback Laser Diode", Sep. 1999.*

* cited by examiner

GAIN-COUPLING DISTRIBUTED FEEDBACK TYPE SEMICONDUCTOR LASER DEVICE

CROSS-REFERENCE TO RELATED APPLICATION

This application is a continuation of International Application No. PCT/JP00/06705 filed Sep. 28, 2000, the entire content of which being incorporated herein by reference

TECHNICAL FIELD

The present invention relates to a gain-coupling distributed feedback type semiconductor laser device, more particularly relates to a gain-coupling distributed feedback type semiconductor laser device which emits light with a high light output power and enables an increase in the threshold current to be kept to a minimum.

BACKGROUND ART

A distributed feedback type semiconductor laser device comprises a predetermined layer structure of semiconductor materials and a cavity having a predetermined cavity length in which is formed a diffraction grating for periodically changing a real or imaginary part of a refractive index and feeding back only laser light of a specific wavelength so as to give wavelength selectivity.

A distributed feedback type semiconductor laser device of a type where only the real part of the refractive index changes periodically inside the cavity is called a refractive index-coupling type, while one of the type where both the real part and imaginary part of the refractive index change periodically is called a gain-coupling type or a complex-coupling type.

Note that in the present invention, the latter of the above types, that is, the type where at least the imaginary part of the refractive index changes periodically, is called a gain-coupling distributed feedback type semiconductor laser device.

Among these types of distributed feedback type semiconductor laser devices, the refractive index-coupling type generally oscillates in two modes near the Bragg wavelength. This is because the difference in the threshold gain between the two modes sandwiching the Bragg wavelength is small. Therefore, this type of laser device suffers from the problem of a difficulty in achieving a single mode oscillation operation. The yield in the single mode becomes lower.

On the other hand, in the case of a gain-coupling distributed feedback type semiconductor laser device, the difference in the threshold gain between the two modes at the two sides of the Bragg wavelength is large, so the yield in a single mode becomes high.

Some gain-coupling distributed feedback type semiconductor laser devices, however, form a diffraction grating inside the cavity by periodically arranging absorbing layers comprised of semiconductor materials absorbing the light of the oscillation wavelength of the device. This type is called an absorbing diffraction grating type.

In an absorbing diffraction grating type of gain-coupling distributed feedback type semiconductor laser device, by giving a loss to only one mode among the two modes at the two sides sandwiching the stop band, the difference in the threshold gain between the two modes is made larger during operation. Therefore, it is possible to realize a high single mode yield with this device. In this case, the peaks of the standing wave which the laser light of the oscillation wavelength forms in the cavity are positioned away from the periodically arranged absorbing layers. In other words, the standing wave which the diffraction grating in the cavity forms has a waveform with peaks avoiding the absorbing layers.

On the other hand, if considering the reflection at the end surfaces of the cavity, since the end surfaces have free end reflection, the peaks of the standing wave match with the positions of the end surfaces of the cavity.

Therefore, if the absorbing layers of the diffraction grating are positioned in a state not matching with the end surfaces of the cavity, the valleys of the standing wave formed by the laser light of the oscillation wavelength in the cavity and the valleys of the standing wave due to the end-surface reflection easily match, so this laser device can realize a low threshold current and a high emission efficiency.

The usual practice however is to form the end surfaces of the semiconductor laser device by cleavage. Since the positions of formation of the cleaved facets (cavity end surfaces) are randomly positioned with respect to the diffraction grating, however, various relative positions occur such as the position of the cleaved facets and the position of the absorbing layers of the diffraction grating matching or not matching. This means that the standing wave to be formed by the diffraction grating and the standing wave to be formed by the end-surface reflection will not necessarily match in all cases.

For example, when the positions of the cleaved facets match with the positions of the absorbing layers of the diffraction grating, the peaks and valleys formed by the diffraction grating become opposite in phase to the peaks and valleys of the standing wave formed by the end-surface reflection. As a result, the oscillation mode is affected by the loss due to the absorbing layers of the diffraction grating and, while single mode oscillation is achieved, an increase in the threshold current or a reduction in the emission efficiency ends up being induced.

On the other hand, when considering increasing the light output power of a distributed feedback type semiconductor laser device, in the past, the method has been adopted of making the reflectance of the front facet (emission end surface) low and making the reflectance of the rear facet for example at least a high 80% and increasing the ratio of the light output power from the front facet.

If the above method is applied so as to realize a higher light output power of a semiconductor laser device of the absorbing diffraction grating type, however, the following problem arises. That is, at the high reflectance rear facet, the valleys and peaks of the standing wave are emphasized by the end surface reflectance, so when these do not match the standing wave due to the distributed feedback, there is the problem that a large increase of the threshold current and a large reduction in the emission efficiency are caused.

An object of the present invention is to solve the problems occurring when trying to realize a high light output power from a gain-coupling distributed feedback type semiconductor laser device giving a low reflectance to the front facet and a high reflectance to the rear facet, in particular a gain-coupling distributed feedback type semiconductor laser device of the absorbing diffraction grating type, and to provide a gain-coupling distributed feedback type semiconductor laser device realizing a high ratio of light output power without causing an increase in the threshold current or a reduction in the emission efficiency.

DISCLOSURE OF THE INVENTION

To achieve the above object, according to the present invention, there is provided a gain-coupling distributed feedback type semiconductor laser device comprised of a diffraction grating at least at part of the inside of a cavity and having a gain or loss periodically changing, a reflectance of one end surface (front facet) of the cavity being not more than 3% and the reflectance of the other end surface (rear facet) being larger than the reflectance of that one end surface and not more than 60%.

In particular, there are provided a gain-coupling distributed feedback type semiconductor laser device wherein the reflectance of the other end surface (rear facet) is 30 to 60%, a gain-coupling distributed feedback type semiconductor laser device wherein said one end surface (front facet) and said other end surface (rear facet) are formed with at least one type of film selected from the group of $SiO_2$, $SiN_x$ ($0 \leq x \leq 1.4$), $\alpha$-Si, and $Al_2O_3$, a gain-coupling distributed feedback type semiconductor laser device wherein the length of said cavity is at least 400 μm, and a gain-coupling distributed feedback type semiconductor laser device wherein said diffraction grating is an absorbing diffraction grating comprised of a semiconductor material absorbing oscillation wavelength light.

BEST MODE FOR WORKING THE INVENTION

In a laser device produced by cleaving the layer structure of a semiconductor material, the reflectance of the cleaved facets is normally about 30%. The laser device of the present invention is a gain-coupling distributed feedback type semiconductor laser device designed to control the reflectance at the cleaved facets to a suitable value by forming a film of a material explained later on the cleaved facets and to thereby obtain a high light output power without causing an increase in the threshold current.

In particular, it is a laser device suitably setting the reflectance at the rear facet side to obtain the above effect even when the resistance of the device as a whole is made small and the cavity length for obtain a high light output power is made at least 400 μm.

In this case, if an absorbing diffraction grating is formed as a diffraction grating in the cavity, there is the advantage that a high single mode performance can be obtained even with a high light output power. Therefore, in the present invention, an absorbing diffraction grating type of a gain-coupling distributed feedback type semiconductor laser device is preferable.

Next, a laser device of the present invention will be explained with reference to the drawings.

Figure 1:
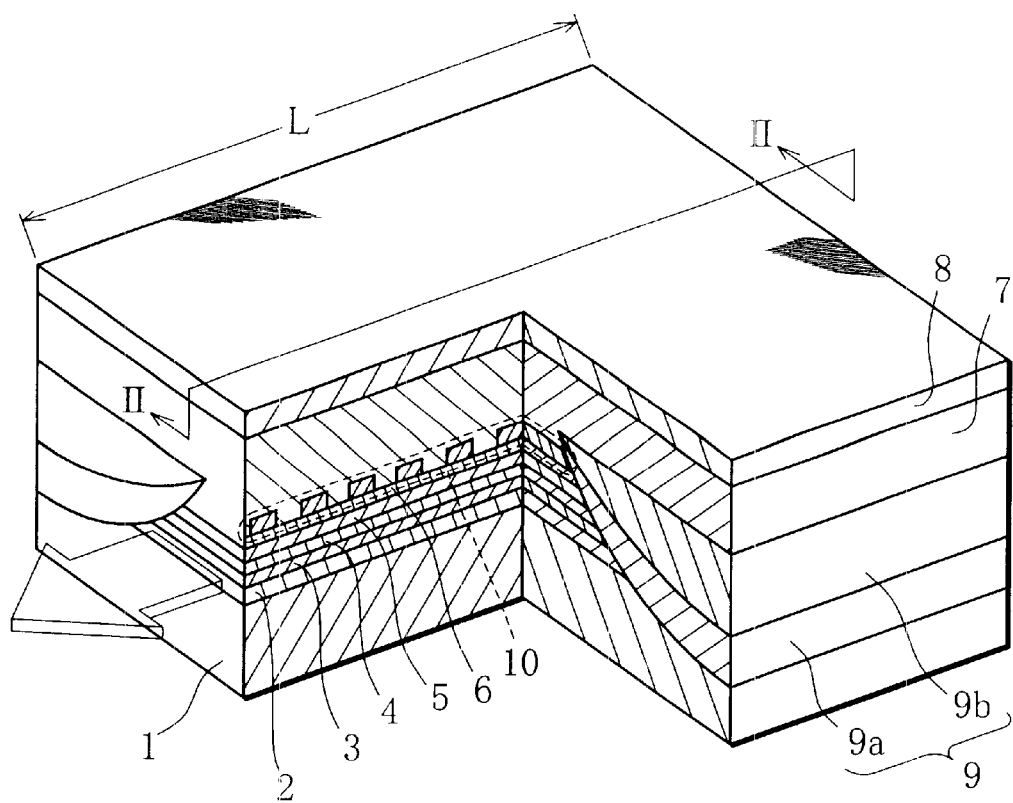
FIG. 1 is a partially cutaway perspective view of an example of a layer structure of a semiconductor device of the present invention.
Figure 2:
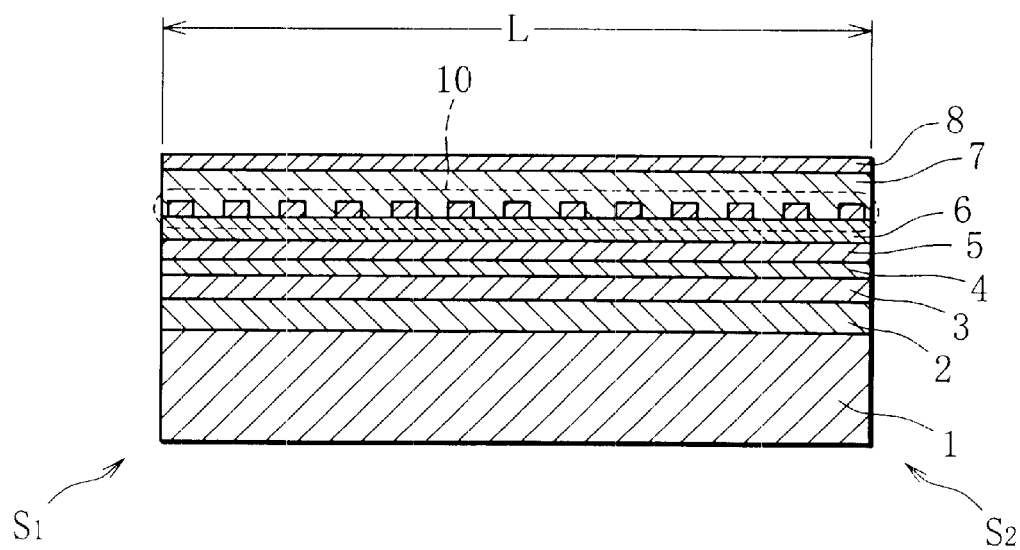
FIG. 2 is a sectional view along the line II-II of FIG. 1.

FIG. 1 is a partially cutaway perspective view of an example of the layer structure of a laser device according to the present invention, while FIG. 2 is a sectional view along the line II-II of FIG. 1.

The laser device has a cavity length L and a layer structure of a substrate 1 comprised of for example n-InP, a buffer layer 2 comprised of n-InP formed on it, a lower optical confinement layer 3 comprised of for example i-GaInAsP, a multiquantum well structure comprised of a GaInAs well layer and a GaInAsP barrier layer, and an upper optical confinement layer 5 comprised of for example i-GaInAsP successively formed on it, and further a spacer layer 6 comprised of for example p-InP and an upper cladding layer 7 comprised of for example p-InP and contact layer 8 comprised of for example p-GaInAsP formed on the upper optical confinement layer 5, with the sides of the overall assembly buried by a burying layer 9 comprised of a layer 9a comprised of for example p-InP and a layer 9b comprised of for example n-InP.

Note that a lower electrode (not shown) is formed on the back surface of the substrate 1 by deposition of for example AuGeNi. An upper electrode (not shown) is formed on the contact layer 8 by deposition of for example Ti/Pt/Au, and reflection layers (not shown) are formed on the two end surfaces of the cavity.

In the layer structure, a diffraction grating 10 is formed as the light absorbing layer in the upper cladding layer 7. The diffraction grating 10 is formed as follows:

First, when forming the layer structure shown in FIG. 2, a spacer layer 6 is formed on the upper optical confinement layer 5, then a semiconductor material is deposited on this to form a layer of a predetermined thickness for use for the diffraction grating. The semiconductor material used at this time may be any material so long as it absorbs light of the oscillation wavelength of the laser device, but for example p-InGaAs may be mentioned.

Next, a resist pattern of the diffraction grating is formed on the surface of this layer, then the layer is etched to the pattern of the diffraction grating having a predetermined periodicity in the longitudinal direction of the cavity. At this time, it is preferable to form the diffraction grating pattern using an electron beam lithography system from the viewpoint of suitability for forming any diffraction grating pattern.

Next, an upper cladding layer 7 is formed on top of this to bury the diffraction grating 10.

In a laser device of the present invention having such a layer structure, a for example $SiN_x$ ($0 \leq x \leq 1.4$) layer is formed on the front facet SI to set the reflectance to not more than 3%.Further, a for example $SiN_x$ ($0 \leq x \leq 1.4$) layer and $\alpha$-Si layer are alternately stacked on the rear facet S2 to set the reflectance to not more than 60%.

If the reflectance of the front facet SI is made larger than 3%, the light output power from the front facet falls. If the reflectance of the rear facet S2 is made larger than 60%, as explained above, the standing wave due to the end-surface reflection at the rear facet and the standing wave due to the distributed feedback of the diffraction grating will interfere with each other and, as a result, there will start to be a remarkable increase in threshold current and decline in emission efficiency. The reflectance at the rear facet S2 is preferably 30 to 60%.

Note that the combination of the film materials at the end surfaces is not limited to the above embodiment. As the film, one or more films selected from the group of $SiO_2$, $SiN_x$ ($0 \leq x \leq 1.4$), $\alpha$-Si, and $Al_2O_3$ may be formed. In this case, the film-forming method is preferably plasma CVD, ECR sputtering, or EB evaporation.

Further, in the laser device of the present invention, the cavity length (L) is preferably set to become at least 400 μm. If the cavity length (L) is made shorter than 400 μm, the emission efficiency becomes higher, but the resistance heat buildup becomes greater and as a result thermal saturation of the light output power at the active layer 4 may occur at a low drive current.

EXAMPLES

An absorbing diffraction grating type of a gain-coupling distributed feedback type semiconductor laser device have the structure shown in FIG. 1 and FIG. 2 was constructed as follows targeting an oscillation wavelength of about 1550 nm.

MOCVD is used to successively form on an n-InP substrate 1 a buffer layer 2 of a thickness of 1 μm comprised of n-InP, a lower optical confinement layer 3 of a thickness of 100 nm comprised of i-$Ga_{0.23}In_{0.77}As_{0.42}P_{0.58}$, an active layer 4 of a quantum well structure formed by a quantum layer comprised of GaInAs and a barrier layer comprised of GaInAsP, and an upper optical confinement layer 5 of a thickness of 100 nm comprised of i-$Ga_{0.23}In_{0.77}As_{0.42}P_{0.58}$.

Next, on this upper optical confinement layer 5, p-InP is stacked to a thickness of 100 nm to form a spacer layer 6, then on this a layer of a thickness of 30 nm comprised of p-InGaAs is formed at a growth temperature of 600° C. This is the layer for conversion to a diffraction grating.

An electron beam resist is coated on this p-InGaAs layer to a thickness of about 100 nm, then an electron beam lithography system is applied to form a resist diffraction grating pattern at a period of about 240 nm.

Next, using this plan pattern as a mask, etching is performed to a depth of 50 nm using a bromine-based etchant not having etching selectivity to the above p-InP layer and p-InGaAs layer to thereby form a diffraction grating of a period of 240 nm comprised of InGaAs and including part of the p-InP.

The resist on the surface is then removed, then p-InP is regrown on the top to bury the diffraction grating and flatten the overall surface. Note that the growth temperature at this time is set to 520° C. to prevent deformation of the diffraction grating formed.

Next, the entire flattened surface is covered by an $Si_3N_4$ film formed by plasma CVD, then photolithography and RIE (reactive ion etching) are applied to form mesa stripes of a width of about 1.5 μm extending in the longitudinal direction of the cavity to be formed using this $Si_3N_4$ film as a mask.

Next, a p-InP layer 9a and n-InP layer 9b are successively selectively grown at the two sides of the mesa stripes to form the burying layer 9.

The $Si_3N_4$ film is removed, then p-InP is formed on the overall surface to form an upper cladding layer 7, then a contact layer 8 comprised of p-GaInAs is formed on this.

The back surface of the substrate 1 is polished to reduce the overall thickness to about 120 μm, then a lower electrode comprised of AuGeNi is formed on the polished surface and an upper electrode comprised of Ti/Pt/Au is formed on the contact layer 8.

The obtained substrate is then cleaved. At this time, the cavity length (L) was changed as shown in Table 1. Further, a-Si and/or $SiN_x$ ($0 \leq x \leq 1.4$) was coated on the cleaved facets to change the reflectances of the front facet S1 and the rear facet S2.

The resultant laser devices were bonded to ordinary can package type stems and the various laser characteristics were investigated. The results are shown in Table 1. The figures in the table are mean values of about 50 laser devices.

TABLE 1

| | | Reflectance (%) | | Light output | | |
|---|---|---|---|---|---|---|
| | Cavity length (μm) | Front facet | Rear facet | Maximum light output power (mW) | Ratio of light output power of front facet/rear facet | Ith (mA: mean value) |
| Device A | 300 | 30 | 30 (as cleaved) | 52 | 1 | 12.2 |
| Device B | 300 | 1 | 30 (as cleaved) | 80 | 7 | 13.4 |
| Device C | 300 | 1 | 50 | 87 | 10 | 13.7 |
| Device D | 300 | 1 | 60 | 95 | 13 | 14.4 |
| Device E | 300 | 1 | 70 | 97 | 16 | 18.5 |
| Device F | 300 | 1 | 80 | 98 | 19 | 19.7 |
| Device G | 300 | 1 | 90 | 98 | 22 | 21.8 |
| Device H | 600 | 1 | 30 (as cleaved) | 126 | 5 | 15.1 |
| Device I | 600 | 1 | 50 | 131 | 8 | 15.6 |
| Device J | 600 | 1 | 60 | 138 | 12 | 16.8 |
| Device K | 600 | 1 | 70 | 139 | 14 | 20.7 |
| Device L | 600 | 1 | 80 | 139 | 16 | 22.5 |
| Device M | 600 | 1 | 90 | 140 | 18 | 25.3 |

From Table 1, the following becomes clear.

(1) As clear from a comparison of device A (comparative example) and device B, if the front facet S1 is given a nonreflecting coating to make the reflectance 1%, the efficiency of extraction of light from the front facet increases as much as seven-fold.

(4) As clear from a comparison of device B, device C, and device D, if the reflectance of the rear facet S2 is raised from 30% to 60% in the state holding the reflectance of the front facet S1 at 1%, the threshold current increases somewhat, but a high light output power can be obtained from the front facet. If however the reflectance of the rear facet S2 is made more than 70% as with the device E, device F, and device G, the ratio of light output power becomes higher, but the threshold current increases widely and the yield in the single mode oscillation falls.

Further, the maximum light output power does not become so large. From this, it is learned that the reflectance of the rear facet S2 should be set to not more than 60% to obtain a large ratio of light output power.

(3) As clear from a comparison of the group of device B to device G and the group of the device H to device M, even if the cavity length is made long, a ratio of light output power as large as when it is short cannot be obtained. If the cavity length becomes long, however, the resistance of the device becomes smaller, so the maximum light output power increases.

(4) If comparing the device E, device F, device G, device K, device L, and device M taking note of the increase of the threshold current when the reflectance of the rear facet is made large, the rate of increase of the threshold current becomes larger than when the cavity length is made large compared with when made short and the ratio of the light output power becomes smaller.

From this, when the cavity length is short, if the reflectance of the front facet is made about 1% and the reflectance of the rear facet is enlarged to 60%, while the threshold current increases somewhat, a large ratio of light output power can be obtained.

Even if the reflectance of the rear facet is made larger than 60%, however, the maximum light output power does not increase that much and conversely the threshold current increases or a reduction in the yield in the single mode ends up occurring.

Further, when the cavity length is long, if the reflectance of the rear facet is increased, not only does the rate of increase of the threshold current rise, but also that ratio of light output power does not become that large. When the cavity length is long, it is particularly important to make the reflectance of the rear facet 60% or lower. Therefore, when desiring to further increase the maximum light output power, increasing the cavity length is considered to be an effective measure.

Capability of Utilization in Industry

As clear from the above explanation, the gain-coupling distributed feedback type semiconductor laser device of the present invention has suitable values for the reflectances of the front facet and the rear facet, so a high light output power from the front facets becomes possible and it is possible to control to a minimum the increase of the threshold current, the reduction of the emission efficiency, and the reduction of the yield in the single mode.

What is claimed is:

1. A gain coupling distributed feedback semiconductor laser device comprising:

a front facet having a reflectivity of not more than 3% and configured to provide a light output from the semiconductor laser;

a rear facet having a reflectivity in the range of 30%–60%;

an absorption diffraction grating formed within a portion of a cavity defined by the front and rear facets, said diffraction grating comprising a periodic structure of semiconductor material that absorbs light at an oscillation wavelength of the semiconductor laser, wherein a length of said cavity is at least 400 $\mu$m.

2. The gain-coupling distributed feedback semiconductor laser device of claim 1, wherein a length of said cavity is at least 600 $\mu$m.

3. The gain-coupling distributed feedback semiconductor laser device of claim 1, wherein a length of said cavity is at least 400 $\mu$m.

4. The gain-coupling distributed feedback semiconductor laser device of claim 3, wherein a length of said cavity is at least 600 $\mu$m.

5. The gain-coupling distributed feedback semiconductor laser device of claim 1, wherein said front facet and said rear are formed with at least one type of film selected from the group of $SiO_2$, $SiN_x$ ($0 \leq x \leq 1.4$), $\alpha$-Si, and $Al_2O_3$.

6. The gain-coupling distributed feedback semiconductor laser device of claim 5, wherein said reflection film is constructed as one of a plasma CVD film, an ECR sputtering film, and an EB evaporation film.

7. A gain coupling distributed feedback semiconductor laser device comprising:

a front facet having a reflectivity of not more than 3% and configured to provide a light output from the semiconductor laser;

a rear facet having a reflectivity larger than the reflectivity of the front facet and not more than 60%;

a diffraction grating formed within a portion of a cavity defined by the front and rear facets, said diffraction grating comprising a periodic structure of semiconductor material that periodically changes a gain or loss of light at an oscillation wavelength of the semiconductor laser, wherein a length of said cavity is at least 400 $\mu$m.

8. The gain-coupling distributed feedback semiconductor laser device of claim 7, wherein said rear facet has a reflectivity in the range of 30% to 60%.

9. The gain-coupling distributed feedback semiconductor laser device of claim 8, wherein said front facet and said rear are formed with at least one type of film selected from the group of $SiO_2$, $SiN_x$ ($0 \leq x \leq 1.4$), $\alpha$-Si, and $Al_2O_3$.

10. The gain-coupling distributed feedback semiconductor laser device of claim 9, wherein said reflection film is constructed as one of a plasma CVD film, an ECR sputtering film, and an EB evaporation film.

11. The gain-coupling distributed feedback semiconductor laser device of claim 7, wherein said front facet and said rear are formed with at least one type of film selected from the group of $SiO_2$, $SiN_x$ ($0 \leq x \leq 1.4$), $\alpha$-Si, and $Al_2O_3$.

12. The gain-coupling distributed feedback semiconductor laser device of claim 11, wherein said reflection film is constructed as one of a plasma CVD film, an ECR sputtering film, and an EB evaporation film.

13. The gain-coupling distributed feedback semiconductor laser device of claim 7, wherein a length of said cavity is at least 600 $\mu$m.

14. The gain-coupling distributed feedback semiconductor laser device of claim 13, wherein said rear facet has a reflectivity in the range of 30% to 60%.

15. The gain-coupling distributed feedback semiconductor laser device of claim 14, wherein said front facet and said rear are formed with at least one type of film selected from the group of $SiO_2$, $SiN_x$ ($0 \leq x \leq 1.4$), $\alpha$-Si, and $Al_2O_3$.

16. The gain-coupling distributed feedback semiconductor laser device of claim 15, wherein said reflection film is constructed as one of a plasma CVD film, an ECR sputtering film, and an EB evaporation film.

* * * * *